US010050098B2

(12) United States Patent
Nam et al.

(10) Patent No.: US 10,050,098 B2
(45) Date of Patent: Aug. 14, 2018

(54) ORGANIC LIGHT-EMITTING DISPLAY DEVICE INCLUDING SUBSTRATE HAVING PLURALITY OF TRENCHES AND METHOD OF FABRICATING THE SAME

(71) Applicant: LG Display Co., Ltd., Seoul (KR)

(72) Inventors: Kyoung-Jin Nam, Gyeonggi-do (KR); Jeong-Oh Kim, Gyeonggi-do (KR); Yong-Min Kim, Gyeonggi-do (KR); Eun-Young Park, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/299,690

(22) Filed: Oct. 21, 2016

(65) Prior Publication Data

US 2017/0186831 A1    Jun. 29, 2017

(30) Foreign Application Priority Data

Dec. 29, 2015 (KR) .................. 10-2015-0188439

(51) Int. Cl.
*H01L 29/08* (2006.01)
*H01L 27/32* (2006.01)
(Continued)

(52) U.S. Cl.
CPC ........ *H01L 27/3272* (2013.01); *H01L 23/544* (2013.01); *H01L 27/3248* (2013.01);
(Continued)

(58) Field of Classification Search
CPC ............. H01L 27/3272; H01L 27/3248; H01L 27/3262; H01L 23/544; H01L 51/52; H01L 51/5212
See application file for complete search history.

(56) References Cited

U.S. PATENT DOCUMENTS 6,157,127 A    12/2000 Hosokawa et al.
2003/0132435 A1    7/2003 Nakazawa et al.
(Continued)

FOREIGN PATENT DOCUMENTS

EP    0888035 A1    12/1998
JP    H1140368 A    2/1999
(Continued)

OTHER PUBLICATIONS

Communication dated May 19, 2017 from the European Patent Office in counterpart EP application No. 16187892.1.
(Continued)

*Primary Examiner* — Matthew Gordon
(74) *Attorney, Agent, or Firm* — Morgan, Lewis & Bockius LLP

(57) ABSTRACT

An organic light-emitting display device and a method of fabricating the same are provided. The organic light-emitting display device includes a substrate having a plurality of trenches; a thin film transistor on the substrate; a light-emitting diode connected to the thin film transistor; an upper auxiliary electrode connected to one of an anode and a cathode of the light-emitting diode; and a lower auxiliary electrode in an auxiliary electrode trench among the plurality of trenches of the substrate and connected to the upper auxiliary electrode.

7 Claims, 7 Drawing Sheets

(51) Int. Cl.
   *H01L 23/544* (2006.01)
   *H01L 51/52* (2006.01)
   *H01L 51/56* (2006.01)
   *H01L 27/12* (2006.01)

(52) U.S. Cl.
   CPC ...... *H01L 27/3262* (2013.01); *H01L 27/3276* (2013.01); *H01L 51/52* (2013.01); *H01L 51/5212* (2013.01); *H01L 51/5228* (2013.01); *H01L 51/56* (2013.01); H01L 27/1218 (2013.01); H01L 27/1225 (2013.01); H01L 27/1288 (2013.01); H01L 27/3246 (2013.01); H01L 2223/54426 (2013.01); H01L 2227/323 (2013.01)

(56) References Cited

U.S. PATENT DOCUMENTS

| | | |
|---|---|---|
| 2007/0099396 A1 | 5/2007 | Hirai et al. |
| 2008/0107972 A1 | 5/2008 | Yamayoshi |
| 2009/0121228 A1 | 5/2009 | Kim et al. |
| 2010/0156860 A1 | 6/2010 | Yamamoto et al. |
| 2012/0146030 A1 | 6/2012 | You et al. |
| 2013/0270526 A1* | 10/2013 | Kim .................... H01L 27/1218 257/40 |
| 2017/0090227 A1* | 3/2017 | Yun ........................ G02F 1/1337 |

FOREIGN PATENT DOCUMENTS

| | | | |
|---|---|---|---|
| JP | 2002015866 A | * | 1/2002 |
| JP | 2007-150258 A | | 6/2007 |
| JP | 2008-116691 A | | 5/2008 |
| JP | 2009-124152 A | | 6/2009 |
| JP | 2009-271188 A | | 11/2009 |
| JP | 2011-171748 A | | 9/2011 |
| WO | 97/34447 A1 | | 9/1997 |

OTHER PUBLICATIONS

Communication dated Oct. 31, 2017 from the Japanese Patent Office in counterpart Japanese application No. 2016-252990.
Communication dated Apr. 4, 2018 from the European Patent Office in counterpart EP application No. 16187892.1.

* cited by examiner

ORGANIC LIGHT-EMITTING DISPLAY DEVICE INCLUDING SUBSTRATE HAVING PLURALITY OF TRENCHES AND METHOD OF FABRICATING THE SAME

This application claims the benefit of Korean Patent Application No. 2015-0188439, filed on Dec. 29, 2015, which is hereby incorporated by reference as if fully set forth herein.

BACKGROUND OF THE INVENTION

Field of the Invention

The present invention relates to an organic light-emitting display device and a method of fabricating the same, and more particularly, to an organic light-emitting display device and a method of fabricating the same that may simplify the configuration of the organic light-emitting display device and may reduce the number of mask processes.

Discussion of the Related Art

An image display device, which displays various information on a screen, is a core technology of the information communication age and is being developed to be thinner, lighter, and more portable, yet with higher performance. As one example of a flat panel display device having a reduced weight and volume as compared to a traditional heavy and bulky cathode ray tube (CRT), an organic light-emitting display (OLED) device, which displays an image by controlling the emission of light from an organic light-emitting layer, has received attention. The OLED device is a self-illuminating device having low power consumption, high response speed, high luminance efficacy, high brightness, and a wide viewing angle.

To fabricate such an OLED device, separate mask processes using photomasks are performed. Each mask process involves a series of processes, such as washing, exposure, developing, and etching processes. To this end, whenever an additional mask process is added, the time and costs for the fabrication of the OLED device increase, and the rate of generation of defective products increases, thereby causing a lower production yield. Therefore, there is a demand for a simplified configuration and a reduction in the number of mask processes to reduce production costs, enhance production yield, and improve production efficiency.

SUMMARY

Accordingly, the present invention is directed to an organic light-emitting display device and a method of fabricating the same that substantially obviate one or more problems due to limitations and disadvantages of the related art.

An object of the present invention is to provide an organic light-emitting display device and a method of fabricating the same that simplifies the configuration of the organic light-emitting display device and reduces the number of mask processes.

Another object of the present invention is to provide an organic light-emitting display device and a method of fabricating the same with reduced production costs, enhanced production yield, and improved production efficiency.

Additional features and advantages of the invention will be set forth in the description which follows, and in part will become apparent from the description, or may be learned by practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light-emitting display device comprises a substrate having a plurality of trenches; a thin film transistor on the substrate; a light-emitting diode connected to the thin film transistor; an upper auxiliary electrode connected to one of an anode and a cathode of the light-emitting diode; and a lower auxiliary electrode in an auxiliary electrode trench among the plurality of trenches of the substrate and connected to the upper auxiliary electrode.

In another aspect, a method of fabricating an organic light-emitting display device, the method comprises forming a plurality of trenches in a substrate; disposing a lower auxiliary electrode in one of the plurality of trenches; forming a thin film transistor on the substrate; forming an anode connected to the thin film transistor and an upper auxiliary electrode connected to the lower auxiliary electrode; forming an organic light-emitting layer on the anode; and forming a cathode on the organic light-emitting layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principles of the invention. In the drawings.

DETAILED DESCRIPTION

Hereinafter, embodiments in accordance with the present invention will be described in detail with reference to the accompanying drawings.

Figure 1:
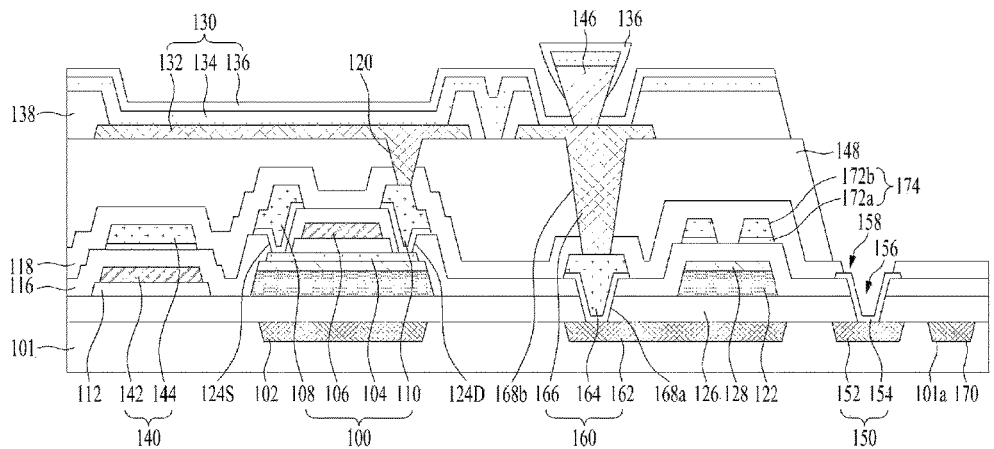
FIG. 1 is a sectional view illustrating a first example embodiment of an organic light-emitting display device in accordance with the present invention.

FIG. 1 is a sectional view illustrating a first example embodiment of an organic light-emitting display device in accordance with the present invention.

As illustrated in FIG. 1, the organic light-emitting display device may include a switching thin-film transistor (not illustrated), a driving thin-film transistor 100, an organic light-emitting diode 130, a storage capacitor 140, an auxiliary electrode 160, a signal pad 150, and an alignment key 170.

The driving thin-film transistor 100 includes a gate electrode 106, a source electrode 108, a drain electrode 110, and an oxide semiconductor layer 104. Meanwhile, the switching thin-film transistor has a similar configuration as that of the driving thin-film transistor 100, and thus includes similar components as those of the driving thin-film transistor 100.

The gate electrode 106 is formed on a gate insulator pattern 112, which may have the same pattern as the pattern of the gate electrode 106. The gate electrode 106 overlaps the oxide semiconductor layer 104 with the gate insulator pattern 112 interposed therebetween. The gate electrode 106 may be a single layer or multiple layers formed of any one selected among molybdenum (Mo), aluminum (Al), chrome (Cr), gold (Au), titanium (Ti), nickel (Ni), neodymium (Nd), and copper (Cu), or an alloy thereof, but is not limited thereto.

The source electrode 108 is connected to the oxide semiconductor layer 104 through a source contact hole 124S, which passes through an interlayer insulator film 116. The drain electrode 110 is connected to the oxide semiconductor layer 104 through a drain contact hole 124D, which passes through the interlayer insulator film 116. In addition, the drain electrode 110 is connected to an anode 132 through a pixel contact hole 120, which passes through a protective film 118 and a planarization layer 148.

Each of the source electrode 108 and the drain electrode 110 may include a transparent conductive layer 172a and an opaque conductive layer 172b formed on the transparent conductive layer 172a. The transparent conductive layer 172a may be formed of a transparent conductive material, such as indium tin oxide (ITO), and the opaque conductive layer 172b may be a single layer or multiple layers formed of any one selected from among molybdenum (Mo), aluminum (Al), chrome (Cr), gold (Au), titanium (Ti), nickel (Ni), neodymium (Nd), and copper (Cu) or an alloy of them, but is not limited thereto.

The oxide semiconductor layer 104 is formed to be below the gate insulator pattern 112 and to overlap, or extend beyond in at least one dimension of the gate electrode 106, thereby forming a channel between the source electrode 108 and the drain electrode 110. The oxide semiconductor layer 104 is formed of an oxide including at least one metal selected among Zn, Cd, Ga, In, Sn, Hf, and Zr. A first buffer layer 126, a heat-resistant buffer layer 122, and a second buffer layer 128 may be sequentially stacked one above another between the oxide semiconductor layer 104 and a light shielding layer 102 and between a signal link 174 and a lower auxiliary electrode 162, thereby effectively ensuring the stability of the device. Here, the heat-resistant buffer layer 122 and the second buffer layer 128 may have the same pattern.

The heat-resistant buffer layer 122 is formed of an organic film material having a lower dielectric constant than those of the first and second buffer layers 126 and 128, for example, acryl resin. The heat-resistant buffer layer 122 is formed below the oxide semiconductor layer 104 of the switching/driving thin-film transistor 100. In addition, the heat-resistant buffer layer 122 is formed below signal links 174, each of which connects at least one signal line, selected among a gate line, a data line, and a power line, with the signal pad 150. Moreover, the heat-resistant buffer layer 122 is also formed between the signal line and the lower auxiliary electrode 162, which intersects (overlaps) the signal line. In this way, (a) the parasitic capacitance between the signal line, each signal link, and the lower auxiliary electrode 162 embedded in a trench 101a of a substrate 101 and (b) the parasitic capacitance between each electrode of the switching/driving thin-film transistor 100 and the light shielding layer 102 are reduced in proportion to the dielectric constant of the heat-resistant buffer layer 122. In this way, signal interference between the signal line, each signal link, and the lower auxiliary electrode 162 embedded in the trench 101a of the substrate 101 and signal interference between each electrode of the switching/driving thin-film transistor 100 and the light shielding layer 102 may be minimized.

The second buffer layer 128 is formed on the heat-resistant buffer layer 122 in the same pattern as the heat-resistant buffer layer 122 and serves to prevent the generation of fumes in the heat-resistant buffer layer 122, which is formed of an organic film material. Therefore, the second buffer layer 128 may prevent, for example, deterioration of the thin-film transistor 100 due to such fumes. The second buffer layer 128 may be formed of SiNx or SiOx, in the same manner as the first buffer layer 126.

The light shielding layer 102, which overlaps the oxide semiconductor layer 104, is embedded in a trench 101a of the substrate 101. The light shielding layer 102 may absorb or reflect light introduced from the outside, and therefore may minimize the introduction of light to the oxide semiconductor layer 104. The light shielding layer 102 may be formed of an opaque metal, such as Mo, Ti, Al, Cu, Cr, Co, W, Ta, Ni, Au, Ag, Sn, or Zn.

The storage capacitor 140 includes a storage lower electrode 142 and a storage upper electrode 144, which overlap each other with the interlayer insulator film 116 therebetween. The storage lower electrode 142, which is the same layer as the gate electrode 106, is formed on the gate insulator pattern 112 using the same material as that of the gate electrode 106. The storage upper electrode 144, which is the same layer as the source electrode 108, is formed on the interlayer insulator film 116 using the same material as that of the source electrode 108.

The light-emitting diode 130 includes the anode 132 connected to the drain electrode 110 of the thin-film transistor 100, an organic light-emitting layer 134 formed on the anode 132, and a cathode 136 formed over the organic light-emitting layer 134.

The anode 132 is connected to the drain electrode 110, which is exposed using the pixel contact hole 120 passing through the protective film 118 and the planarization layer 148. Meanwhile, in a top emission type organic light-emitting display device, the anode 132 may be formed as a stack in which a transparent conductive layer, which is formed of, for example, indium tin oxide (ITO) or indium zinc oxide (IZO), and a metal layer, which is formed of, for example, aluminum (Al), silver (Ag), or APC (Ag; Pb; Cu) are stacked one above another.

The organic light-emitting layer 134 is formed on the anode 132 in a light-emitting area defined by a bank 138. The organic light-emitting layer 134 is formed by stacking, on the anode 132, a hole-related layer, a light-emitting layer, and an electron-related layer, either in that order or in the reverse order.

The bank 138 has an inner side surface in contact with the organic light-emitting layer 134, and an outer side surface disposed along the side surface of the anode 132 to cover the side surface of the anode 132. As such, because the bank 138 is formed along the rim of the anode 132 except the light-emitting area to cover the side surface of the anode 132, the light-emitting area has an island shape. The bank 138 may be formed of an opaque material (e.g., a black material) to prevent optical interference between neighboring sub-pixels. In this case, the bank 138 includes a light shielding material formed of at least one selected among a color pigment, organic black materials, and carbon materials.

The cathode 136 is formed on the upper surface and the side surface of the organic light-emitting layer 134 and the bank 138 to be opposite the anode 132 with the organic light-emitting layer 134 interposed therebetween. In a top emission type organic light-emitting display device, the cathode 136 may be formed of a transparent conductive oxide (TCO).

The auxiliary electrode 160 may reduce the resistance of the cathode 136, which increases as the area of the organic light-emitting display device increases. The auxiliary electrode 160 includes the lower auxiliary electrode 162, an intermediate auxiliary electrode 164, and an upper auxiliary electrode 166.

The lower auxiliary electrode 162 is embedded in the trench 101a of the substrate 101 and is formed of the same material as that of the light shielding layer 102. Because the lower auxiliary electrode 162 is embedded in the trench 101a of the substrate 101 to be formed below the heat-resistant buffer layer (thick film), which prevents signal interference unlike a related art lower auxiliary electrode that would be formed on a thick organic film, process failure, such as erosion, may be prevented, thereby ensuring structural stability.

The intermediate auxiliary electrode 164 is electrically connected to the lower auxiliary electrode 162, which is exposed via a first auxiliary contact hole 168a passing through the first buffer layer 126 and the interlayer insulator film 116. The intermediate auxiliary electrode 164 includes the transparent conductive layer 172a and the opaque conductive layer 172b formed on the transparent conductive layer 172a.

The upper auxiliary electrode 166 is electrically connected to the intermediate auxiliary electrode 164, which is exposed via a second auxiliary contact hole 168b passing through the protective film 118 and the planarization layer 148. The upper auxiliary electrode 166 is formed in the same plane as the anode 132 using the same material as that of the anode 132.

A partition 146, which is formed on the upper auxiliary electrode 166, has an inversely tapered shape, the width of which gradually increases with decreasing distance to the upper surface of the partition 146. Through the provision of the partition 146, the material of the organic light-emitting layer 134, which is deposited vertically downward, is formed only on the upper surface of the partition 146 and the upper surface of the anode 132, which is located in the light-emitting area exposed by the bank 138. On the other hand, the material of the cathode 136, which has step coverage superior to that of the material organic light-emitting layer 134, is also formed on the side surfaces of the partition 146 and the bank 138. Thus, the material of the cathode 136 may be easily brought into contact with the upper auxiliary electrode 166. Meanwhile, although the case where the upper auxiliary electrode 162 is connected to the cathode 136 has been described by way of example, the upper auxiliary electrode 162 may be connected to the anode 132.

The signal pad 150 is connected to at least one signal line among the gate line, the data line, and the power line through the signal link 174. The signal pad 150 includes a lower pad electrode 152 and an upper pad electrode 154.

The lower pad electrode 152 is formed of the same material as that of the light shielding layer 102, and is embedded in the trench 101a of the substrate 101. The upper pad electrode 154 is electrically connected to the lower pad electrode 152, which is exposed through a pad contact hole 156, which passes through the first buffer layer 126 and the interlayer insulator film 116. The upper pad electrode 154 includes the transparent conductive layer 172a. The upper pad electrode 154 is exposed to the outside by a pad hole 158 passing through the first protective film 118.

The alignment key 170 serves as a rule for positional alignment between the substrate 101 and a fabrication device (e.g., a photomask or a shadow mask) that is used to form a thin film on the substrate 101. The alignment key 170 may be embedded in a trench 101a of the substrate 101, in the same manner as the light shielding layer 102, the lower auxiliary electrode 162, and the lower pad electrode 152, as illustrated in FIG. 1, or may be formed on the substrate 101 in the state in which each of the light shielding layer 102, the lower auxiliary electrode 162, and the lower pad electrode 152 is embedded in the trench 101a.

Figure 3A:
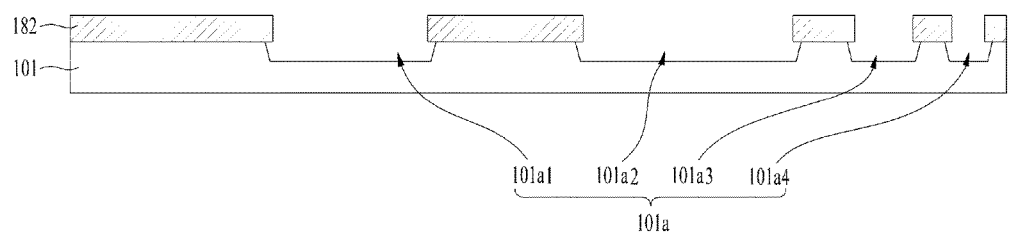
FIGS. 3A to 3D are sectional views illustrating a method of fabricating a light shielding layer, a lower auxiliary electrode, a lower pad electrode, an alignment key, and trenches for a device as illustrated in FIG. 1.
Figure 3B:
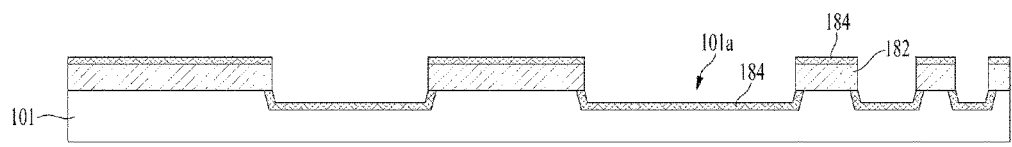
Figure 3C:
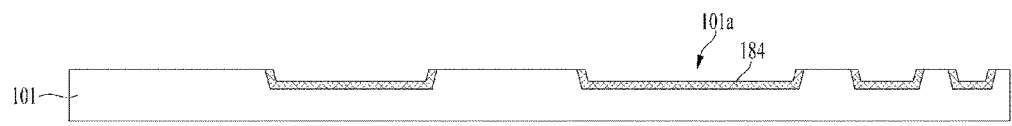
Figure 3D:
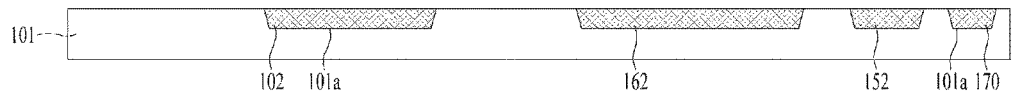

The alignment key 170 illustrated in FIG. 1 is formed via electroplating or electroless plating as illustrated in FIGS. 3A to 3D. Specifically, after a photoresist pattern 182 is formed on the substrate 101 via a photolithography process, as illustrated in FIG. 3A, the substrate 101 is patterned via an etching process in which the photoresist pattern 182 is used as a mask, whereby a plurality of trenches 101a (including trenches to serve as a light shielding trench 101a1, an auxiliary electrode trench 101a2, a lower pad trench 101a3, and an alignment key trench 101a4) is formed in the substrate 101. Subsequently, as illustrated in FIG. 3B, a seed metal 184 is deposited at room temperature on the substrate 101 on which the photoresist pattern 182 remains. Here, the seed metal 184 is a low-resistance metal, such as silver (Ag), gold (Au), copper (Cu), nickel (Ni), tin (Sn), or zinc (Zn). Subsequently, as illustrated in FIG. 3C, the photoresist pattern 182 and the seed metal 184 on the photoresist pattern 182 are removed via the stripping of the photoresist pattern 182. Subsequently, as the seed metal 184 remaining in the trenches 101a is grown, as illustrated in FIG. 3D, the light shielding layer 102, the lower auxiliary electrode 162, the lower pad electrode 152, and the alignment key 170 are simultaneously formed in the trenches 101a. Meanwhile, the light shielding layer 102, the lower auxiliary electrode 162, the lower pad electrode 152, and the alignment key 170, which are formed of the seed metal (e.g., Cu) using electroplating or electroless plating, have the same resistivity as a thin layer, which is formed of copper Cu via deposition.

Figure 2:
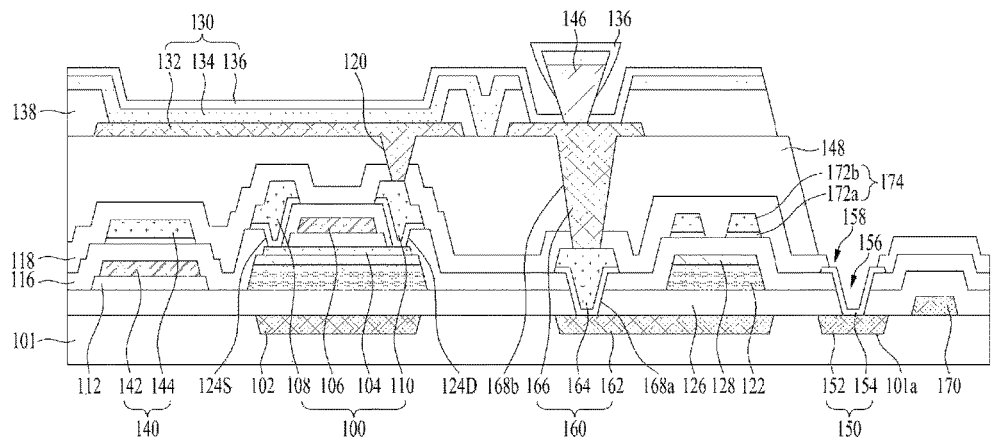
FIG. 2 is a sectional view illustrating a second example embodiment of an organic light-emitting display device in accordance with the present invention.
Figure 4A:
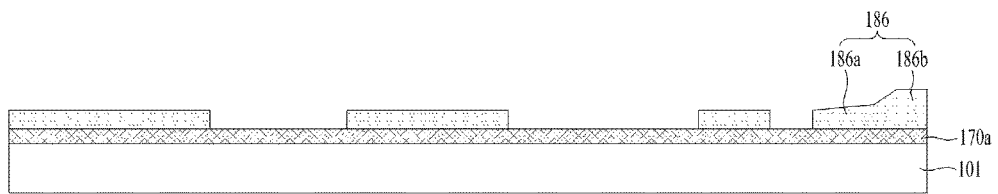
FIGS. 4A to 4D are sectional views illustrating a method of fabricating a light shielding layer, a lower auxiliary electrode, a lower pad electrode, an alignment key, and trenches for a device as illustrated in FIG. 2.
Figure 4B:
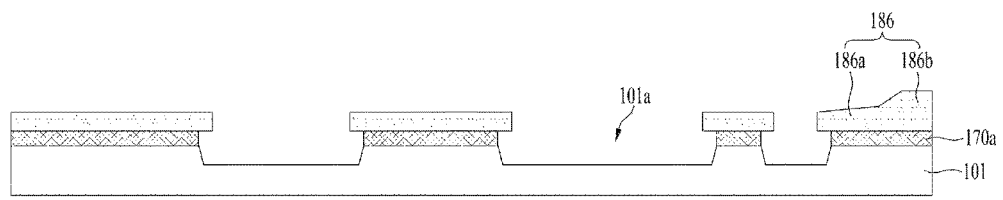

The alignment key 170 illustrated in FIG. 2 is formed using a multi-stepped photoresist pattern 186 as illustrated in FIGS. 4A to 4D. Specifically, as illustrated in FIG. 4A, after an opaque metal layer 170a is deposited throughout the surface of the substrate 101, the multi-stepped photoresist pattern 186 is formed on the opaque metal layer 170a via a photolithography process using a halftone mask. The multi-stepped photoresist pattern 186 includes a first photoresist pattern 186a having a first thickness and a second photoresist pattern 186b having a second thickness, which is greater than the first thickness. By etching the opaque metal layer 170a and the substrate 101 via an etching process in which the multi-stepped photoresist pattern 186 is used as a mask, as illustrated in FIG. 4B, the opaque metal layer 170a remains between the multi-stepped photoresist pattern 186 and the substrate 101, and the trenches 101a are formed in the substrate 101.

Figure 4C:
Figure 4D:

Subsequently, by asking the photoresist pattern 186, the second photoresist pattern 186b is reduced in thickness, and the first photoresist pattern 186a is removed. By etching the opaque metal layer 170a using the second photoresist pattern 186b, having a reduced thickness, as a mask, as illustrated in FIG. 4C, the remaining opaque metal layer 170a excluding the opaque metal layer 170a located below the second photoresist pattern 186b is removed. The remaining opaque metal layer 170a below the second photoresist pattern 186b becomes the alignment key 170. The photoresist pattern 186b remaining on the alignment key 170, as illustrated in FIG. 4D, is removed via a stripping process. After the alignment key 170 is formed, an opaque metal layer is deposited on the substrate 101 in which the trenches 101a have been formed and, thereafter, is patterned via a photolithography process and an etching process. Thus, the light shielding layer 102, the lower auxiliary electrode 162, and the lower pad electrode 152 are simultaneously formed in the trenches 101a.

Figure 5:
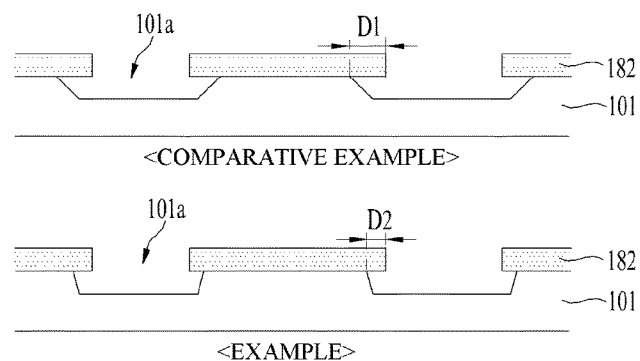
FIG. 5 is a view comparing a comparative example in which no surface treatment is performed on a substrate and an example in which a surface treatment is performed on a substrate with each other.

Meanwhile, an etching process using the photoresist pattern 182 as a mask is required to form the trenches 101a in the substrate 101. However, in the case of a comparative example in which the adhesive force between the substrate 101 and the photoresist pattern 182 is not good, as illustrated in FIG. 5, an etching solution permeates between the substrate 101 and the photoresist pattern 182. Thus, an undercut having a first width D1 is formed between the side surface of the substrate 101 and the photoresist pattern 182. The width of the substrate 101 located between the neighboring trenches 101a may be reduced, thereby causing short circuits between electrodes embedded in the trenches 101a and extending the tails of the electrodes in the trenches 101a, which makes it difficult to achieve high resolution.

On the other hand, in an example of the present invention, prior to applying a photoresist onto the substrate 101, hexamethyldisilazane (HMDS) is applied onto the substrate 101 for the surface treatment of the substrate 101. Because HMDS serves to increase adhesive force between the substrate 101 and the photoresist pattern 182, upon etching of the substrate 101, an etching solution can be prevented from permeating between the substrate 101 and the photoresist pattern 182. Thus, an undercut having a second width D2, which is smaller than that of the comparative example, is formed between the side surface of the substrate 101 and the photoresist pattern 182. In this way, the width of the substrate 101 located between the neighboring trenches 101a may be greater than that in the comparative example, thus preventing short circuits between electrodes embedded in the trenches 101a and shortening the tails of the electrodes in the trenches 101a, which facilitates realization of high resolution.

FIGS. 6A to 6H are sectional views illustrating a method of fabricating the organic light-emitting display device of FIG. 1. Meanwhile, because the method of fabricating the organic light-emitting display device of FIG. 2 is similar to the method of fabricating the organic light-emitting display device of FIG. 1 from the formation of the first buffer layer 126, a description related to the method of fabricating the organic light-emitting display device of FIG. 2 is omitted therein.

Figure 6A:
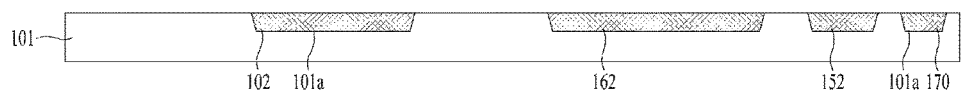
FIGS. 6A to 6H are sectional views illustrating a method of fabricating the organic light-emitting display device of FIG. 1.

As shown in FIG. 6A, as described above with reference to FIGS. 3A to 3D, the trenches 101a are formed in the substrate 101, and the light shielding layer 102, the lower auxiliary electrode 162, the lower pad electrode 152, and the alignment key 170 are embedded in the trenches 101a.

Figure 6B:
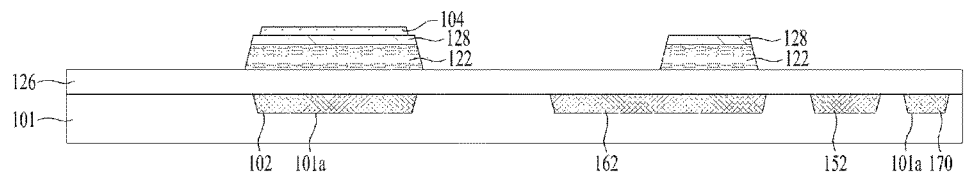

As shown in FIG. 6B, the first buffer layer 126 is formed on the substrate 101 in which the light shielding layer 102, the lower auxiliary electrode 162, the lower pad electrode 152, and the alignment key 170 have been formed in the trenches 101a, and the heat-resistant buffer layer 122, the second buffer layer 128, and the oxide semiconductor layer 104 are formed on the first buffer layer 126. Specifically, the first buffer layer 126, the heat-resistant buffer layer 122, the second buffer layer 128, and the oxide semiconductor layer 104 are formed via deposition on the substrate 101 in which the light shielding layer 102, the lower auxiliary electrode 162, the lower pad electrode 152, and the alignment key 170 have been formed in the trenches 101a. Subsequently, the heat-resistant buffer layer 122, the second buffer layer 128, and the oxide semiconductor layer 104 are selectively etched via a photolithography process using a halftone mask and an etching process. Thus, the heat-resistant buffer layer 122, the second buffer layer 128, and the oxide semiconductor layer 104, which have the same pattern, are sequentially stacked one above another in the area at which they overlap the light shielding layer 102, and the heat-resistant buffer layer 122 and the second buffer layer 128 are sequentially stacked one above another in the area at which they overlap the lower auxiliary electrode 162.

In this way, the heat-resistant buffer layer 122 and the second buffer layer 128 are formed via the same mask process as the oxide semiconductor layer 104. In this case, because the heat-resistant buffer layer 122, which has different etching properties from those of the second buffer layer 128 and the oxide semiconductor layer 104, is disposed below the second buffer layer 128 and the oxide semiconductor layer 104, process failure, such as the occurrence of undercutting may be prevented after the etching process, and process stability may be acquired.

Figure 6C:
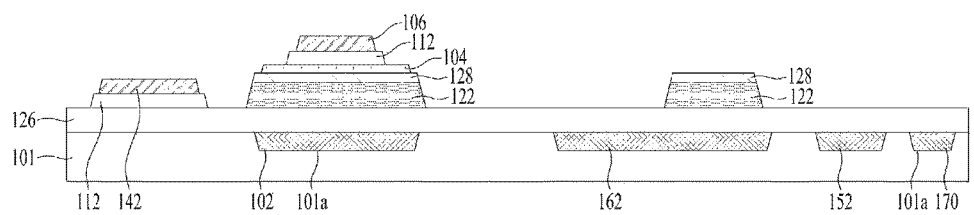

With reference to FIG. 6C, the gate insulator pattern 112, the lower storage electrode 142, and the gate electrode 106 are formed on the substrate 101 on which the heat-resistant buffer layer 122, the second buffer layer 128, and the oxide semiconductor layer 104 have been formed. Specifically, a gate insulator film is formed on the substrate 101 on which the heat-resistant buffer layer 122, the second buffer layer 128, and the oxide semiconductor layer 104 have been formed, and a gate metal layer is formed on the gate insulator film via deposition, such as sputtering. The gate insulator film is formed of an inorganic insulation material, such as SiOx or SiNx. The gate metal layer may be a single layer formed of a metal, such as Mo, Ti, Cu, AlNd, Al, Cr, or an alloy thereof, or may be multiple layers using the same. Subsequently, by simultaneously patterning the gate metal layer and the gate insulator film via a photolithography process and an etching process, each of the gate electrode 106 and the lower storage electrode 142 may be formed in the same pattern as the gate insulator pattern 112.

Figure 6D:
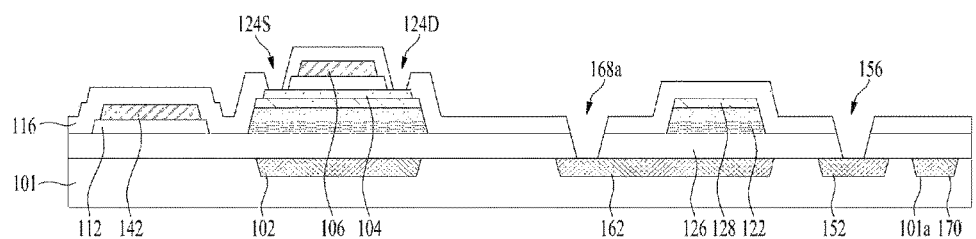

As shown in FIG. 6D, the interlayer insulator film 116, which has the source and drain contact holes 124S and 124D, the first pad contact hole 156, and the first auxiliary contact hole 168a, is formed on the substrate 101 on which the gate electrode 106 and the lower storage electrode 142 are formed. Specifically, the interlayer insulator film 116 is formed on the substrate 101, on which the gate electrode 106 and the lower storage electrode 142 are formed, via deposition, such as PECVD. Subsequently, by patterning the interlayer insulator film 116 and the first buffer layer 126 via a photolithography process and an etching process, the source and drain contact holes 124S and 124D, the first pad contact hole 156, and the first auxiliary contact hole 168a are formed.

Figure 6E:
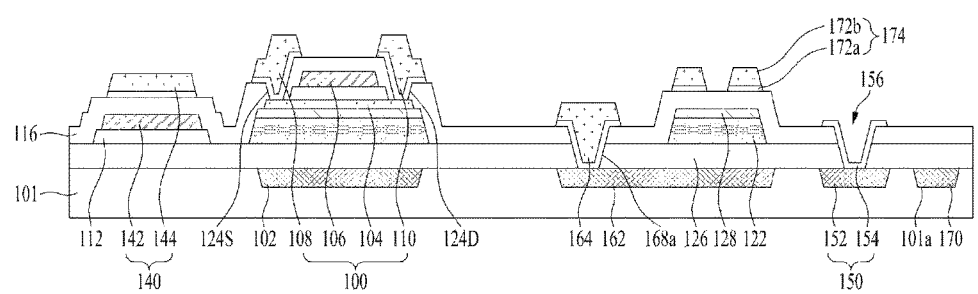

In FIG. 6E, the source electrode 108, the drain electrode 110, the upper storage electrode 144, and the upper pad electrode 154 are formed on the interlayer insulator film 116, which has the source and drain contact holes 124S and 124D, the first pad contact hole 156, and the first auxiliary contact hole 168a. Specifically, the transparent conductive layer 172a and the opaque conductive layer 174 are sequentially deposited via, for example, sputtering on the interlayer insulator film 116, which has the source and drain contact holes 124S and 124D, the first pad contact hole 156, and the first auxiliary contact hole 168a. Subsequently, by patterning transparent conductive layer 172a and the opaque conductive layer 174 via a photolithography process using a halftone mask and an etching process, the source electrode 108, the drain electrode 110, the upper storage electrode 144, and the upper pad electrode 154 are formed. At this time, the source electrode 108, the drain electrode 110, and the upper storage electrode 144 take the form of a stack including the transparent conductive layer 172a and the opaque conductive layer 174, and the upper pad electrode 154 is formed of the transparent conductive layer 172a, which has high corrosion resistance and acid resistance.

Figure 6F:
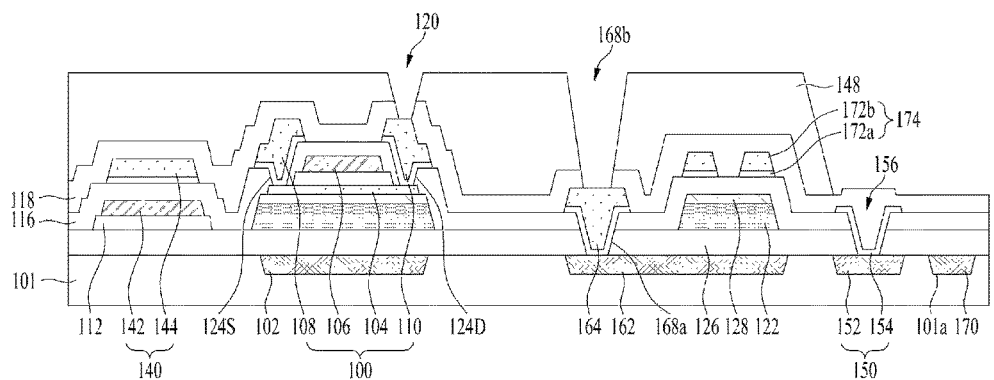

With reference to FIG. 6F, the protective film 118 and the planarization layer 148, which have the pixel contact hole 120 and the second auxiliary contact hole 168b, are formed on the interlayer insulator film 116, on which the source electrode 108, the drain electrode 110, the upper storage electrode 144, and the upper pad electrode 154 have been formed. Specifically, the protective film 118 and the planarization layer 148 are sequentially formed on the interlayer insulator film 116, on which the source electrode 108, the drain electrode 110, the upper storage electrode 144, and the upper pad electrode 154 have been formed. The protective film 118 is formed of an inorganic insulation material, such as SiOx or SiNx, and the planarization layer 148 is formed of an organic insulation material, such as photoacryl. Subsequently, by selectively etching the protective film 118 and the planarization layer 148 via a photolithography process using a halftone mask and an etching process, the pixel contact hole 120 and the second auxiliary contact hole 168b are formed. The pixel contact hole 120 penetrates the protective film 118 and the planarization layer 148 to expose the drain electrode 110, and the second auxiliary contact hole 168b penetrates the protective film 118 and the planarization layer 148 to expose the intermediate auxiliary electrode 164. Then, the planarization layer 148 is selectively removed from the top of the signal pad 150 so that the protective film 118 on the top of the signal pad 150 is exposed.

Figure 6G:
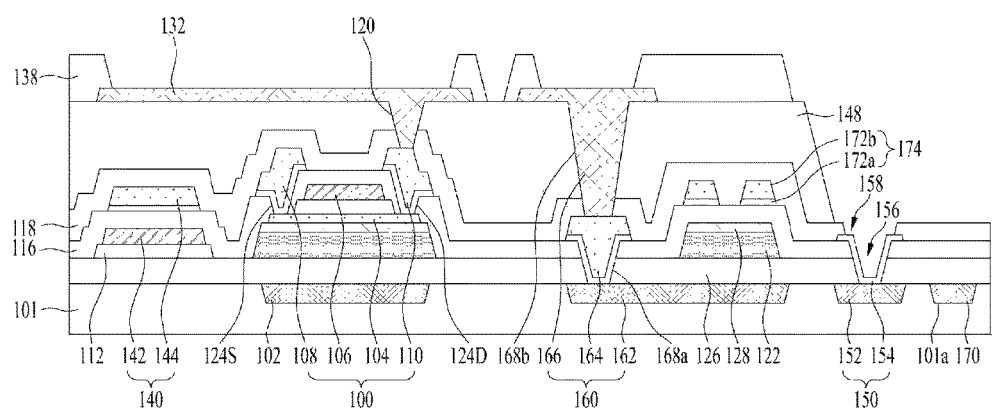

In FIG. 6G, the anode 132, the bank 138, and the pad hole 158 are formed on the substrate 101 on which the protective film 118 and the planarization layer 148, which have the pixel contact hole 120 and the second auxiliary contact hole 168b, have been formed. Specifically, an opaque conductive film and a bank photosensitive film are applied throughout the surface of the substrate 101 on which the protective film 118 has been formed. Subsequently, by patterning the bank photosensitive film, the opaque conductive film, and the protective film 118 via a photolithography process using a halftone mask and an etching process, the anode 132, the bank 138, and the pad hole 158 are formed.

Figure 6H:
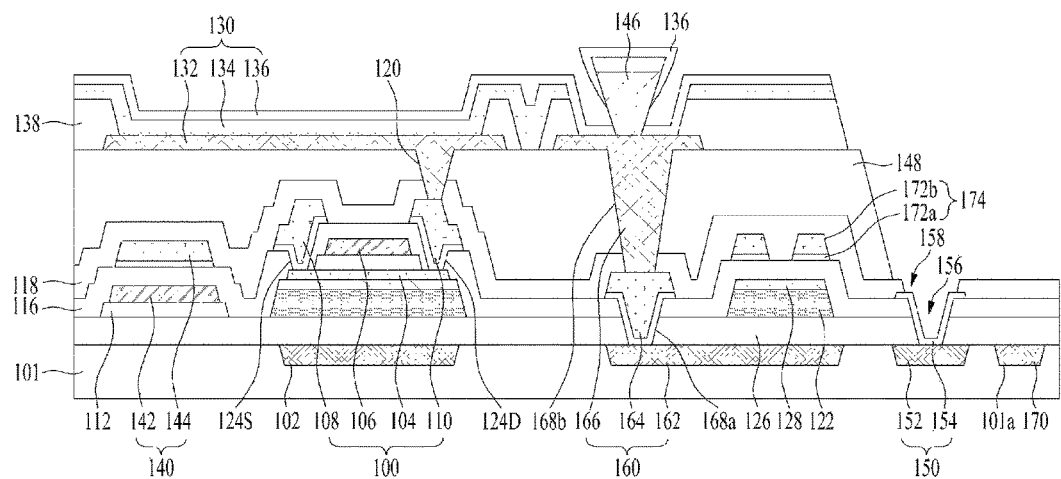

As shown in FIG. 6H, the partition 146, the organic light-emitting layer 134, and the cathode 136 are sequentially formed on the substrate 101, which has the anode 132, the bank 138, and the pad hole 158. Specifically, after a partition photosensitive film is applied onto the substrate having the anode 132, the bank 138, and the pad hole 158, the partition photosensitive film is patterned via a photolithography process to form the inversely tapered partition 146. Subsequently, the organic light-emitting layer 134 is formed in the light-emitting area exposed by the bank 138, and the cathode 136 is formed on the substrate 101 on which the organic light-emitting layer 134 has been formed.

As described above, in the organic light-emitting display device in accordance with the present invention, the light shielding layer 102 and the lower auxiliary electrode 162 are formed via the same single mask process, and the oxide semiconductor layer 104, the heat-resistant buffer layer 122, and the second buffer layer 128 are formed via the same single mask process. In this way, the organic light-emitting display device in accordance with the present invention may reduce the number of mask processes by a total of at least 2 processes compared to the prior art, thereby achieving enhanced productivity and reduced costs.

In addition, in the present invention, because the lower auxiliary electrode 162 is embedded in the trench 101a of the substrate 101 and the heat-resistant buffer layer 122 is disposed on the substrate 101, the heat-resistant buffer layer may prevent corrosion failure of a signal line including the lower auxiliary electrode 162, thereby ensuring structural stability.

Meanwhile, although the present invention has described the case where the semiconductor layer 104 of the driving thin-film transistor 100 is formed of an oxide by way of example, the semiconductor layer 104 of the driving thin-film transistor 100 may be formed of polysilicon.

It will be apparent to those skilled in the art that the present invention described above is not limited to the embodiments described above and the accompanying drawings, and various substitutions, modifications, and alterations may be devised within the spirit and scope of the present invention.

What is claimed is:

1. An organic light-emitting display device, comprising:
a substrate having a plurality of trenches;
a thin film transistor on the substrate;
a light-emitting diode connected to the thin film transistor;
an upper auxiliary electrode connected to one of an anode and a cathode of the light-emitting diode;
a lower auxiliary electrode in an auxiliary electrode trench among the plurality of trenches of the substrate and connected to the upper auxiliary electrode; and
a light shielding layer overlapping with the thin film transistor, wherein the light shielding layer is embedded in a light shielding trench among the plurality of trenches of the substrate.

2. The organic light-emitting display device of claim 1, further comprising a first buffer layer on the substrate.

3. The organic light-emitting display device of claim 2, further comprising:
a heat-resistant buffer layer; and
a second buffer layer,
wherein the first buffer layer, the heat-resistant buffer layer, and the second buffer layer are sequentially stacked one above another between the light shielding layer and the thin film transistor.

4. The organic light-emitting display device of claim 3, wherein the heat-resistant buffer layer includes an organic film material having a lower dielectric constant than those of the first and second buffer layers.

5. The organic light-emitting display device of claim 2, further comprising a lower pad electrode embedded in a lower pad trench of the substrate and an upper pad electrode connected to the lower pad electrode through the first buffer layer.

6. The organic light-emitting display device of claim 5, further comprising:
   a signal link located above the lower auxiliary electrode; and
   a signal pad connected to the signal link,
   wherein the first buffer layer, the heat-resistant buffer layer, and the second buffer layer are sequentially stacked one above another between the lower auxiliary electrode and the signal link, and
   wherein:
      the signal pad includes the lower pad electrode and the upper pad electrode;
      the upper pad electrode is connected to the lower pad electrode through a pad contact hole, and
      the pad contact hole passes through the first buffer layer and an interlayer insulator film.

7. The organic light-emitting display device of claim 1, further comprising an alignment key embedded in an alignment key trench among the plurality of trenches of the substrate, or disposed on the substrate.

* * * * *